United States Patent [19]

Nilsson

[11] 4,034,279
[45] July 5, 1977

[54] METHOD AND A DEVICE FOR DETERMINING GAS GENERATION WITH ELECTRODES IN CONTACT WITH ELECTROLYTES

[75] Inventor: Bruno Yngve Nilsson, Boliden, Sweden

[73] Assignee: Boliden Aktiebolag, Stockholm, Sweden

[22] Filed: Dec. 22, 1975

[21] Appl. No.: 643,162

Related U.S. Application Data

[63] Continuation of Ser. No. 486,591, July 8, 1974, abandoned.

[30] Foreign Application Priority Data

July 13, 1973 Sweden .............................. 7309890

[52] U.S. Cl. ................................. 320/20; 320/39; 320/46
[51] Int. Cl.² ................................................ H02J 7/04

[58] Field of Search .................. 320/20, 21, 35, 36, 320/39, 40, 46

[56] References Cited

UNITED STATES PATENTS

| | | |
|---|---|---|
| 2,420,577 | 5/1947 | Van Lew .............................. 320/40 |
| 3,289,065 | 11/1966 | Dehmelt et al. ...................... 320/40 |
| 3,794,905 | 2/1974 | Long .................................. 320/20 |
| 3,886,428 | 5/1975 | Macharg .............................. 320/39 |

*Primary Examiner*—Robert J. Hickey
*Attorney, Agent, or Firm*—Stevens, Davis, Miller & Mosher

[57] ABSTRACT

A method and a device for determining the charging condition of electric accumulators, wherein the potential variations at the electrolyte-electrode interface are time differentiated in order to determine the degree of gas development in said accumulators.

2 Claims, 1 Drawing Figure

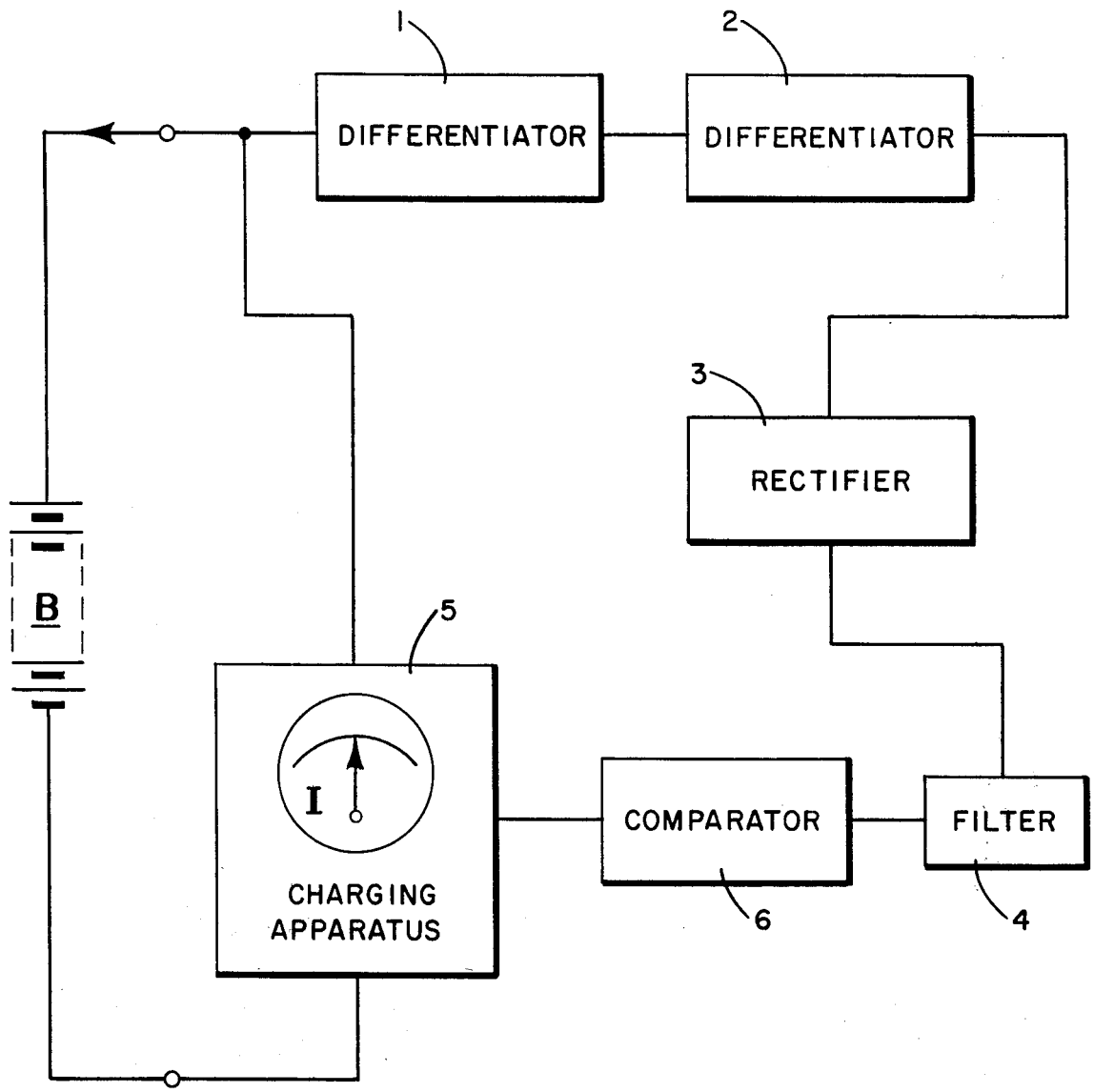

METHOD AND A DEVICE FOR DETERMINING GAS GENERATION WITH ELECTRODES IN CONTACT WITH ELECTROLYTES

This is a continuation of application Ser. No. 486,591 filed July 8, 1974, now abandoned.

The present invention relates to a method and a device for indicating the generation of gas with electrodes, especially for indicating incipient gas development at the electrodes in an accumulator during its charging.

The method according to the invention is essentially characterized in that resistance fluctations in the transition zone between the electrolyte and electrode due to the gas generation are determined by differentiating the terminal voltage in respect of time. The differentiated voltage is rectified and filtered to obtain D.C. voltage, the level of which is a measure of the intensity of the gas generation process. The level is then sensed and the value of the charging current in response to the sensed level is governed.

The device according to the invention is essentially characterized by a first and a second differentiator arranged to double differentiate the terminal voltage of the accumulator, a rectifier and a filter coupled in series and supplied by said second differentiator and adapted to deliver a D.C. voltage to a comparator, which is a measure of the intensity of the gas generation process into the accumulator, said comparator being set for sensing the level of said D.C. voltage and in response to the sensed level to govern the charging apparatus either to cut out the charging current completely, or to reduce it successively to maintain a low constant gas generation level in the accumulator during continued charging.

The method and device according to the invention will now be more fully described with reference to the attached drawing, which shows a circuit diagram in the block form.

A battery B is to be charged by means of a charging apparatus 5 in the form of a constant current generator.

A device according to the invention is connected to battery B and to charging apparatus 5, for registering the gas generation process during charging. This device comprises a first and a second differentiator 1 and 2 respectively, a rectifier 3, a filter 4, connected in series, and a level sensing comparator 6 arranged to govern the charging apparatus 5.

The method of operation is such that the terminal voltage of the accumulator is double differentiated in the cascasde connected differentiators 1 and 2. The first differentiator 1 derives the terminal voltage in respect of time, and the second differentiator 2 time derives the time derivative obtained from the differentiator 1. The second time derivative of the terminal voltage thus obtained presents positive and negative variations, and is rectified in the rectifier 3 and filtered in the filter 4. The D.C. voltage obtained from filter 4 is a measurement of the intensity of the gas generating process in the accumulator, and its D.C. voltage level is sensed in the comparator 6. The D.C. voltage in question will increase in response to the increase of the gas generation within the accumulator during the charging process.

There are at least two possibilities of governing the charging of the accumulator by means of the device according to the invention.

One possibility resides therein that, when the gas generation intensity attains a certain predetermined degree, i.e. when said D.C. voltage reaches a definite value, the charging is broken off completely. A comparatively large charing current has then been used, and the accumulator has been fully charged when said degree and value have been reached. Charging current I from the charging apparatus is then directly reduced to zero through the automatic control of the apparatus exercised by the comparator 6 in response to the voltage from the filter 4 having attained a predetermined level corresponding to full accumulator charge.

A second possibility is that when the gas generation process has reached a certain lower level compared with the aforementioned first possibility, the charging current is succesively reduced by means of the comparator 6, which is set at another lower level. The gas generating level in the accumulator is then kept at a low constant value.

The invention has been described with reference to a single embodiment, but a number of variations fall within the scope of the patent claims.

I claim:

1. A method for controlling the charging condition of an electric accumulator, characterized by the steps of determining the resistance fluctuations at an electrolyte-electrode interface due to the gas generation by time differentiating the terminal voltage, rectifying and filtering the differentiated voltage to obtain a D.C. voltage, the level of which being a measure of the intensity of the gas generation process, sensing said level and governing the value of the charging current in response to the sensed level.

2. A device for controlling the charging condition of an electric accumulator, comprising a first and a second differentiator arranged to double differentiate the terminal voltage of the accumulator, a rectifier and a filter coupled in series and supplied by said second differentiator and adapted to deliver a D.C. voltage which is a measure of the intesity of the gas generation process in the accumulator, a comparator supplied by said D.C. voltage and being arranged to sense the level of said D.C. voltage, and means to govern the charging apparatus in response to the sensed level to reduce the charging current in order to maintain a low constant gas generation level in the accumulator during continued charging.

* * * * *